(12) United States Patent
Suda (10) Patent No.: US 7,489,387 B2
(45) Date of Patent: Feb. 10, 2009

(54) EXPOSURE APPARATUS AND DEVICE FABRICATION METHOD

(75) Inventor: Hiromi Suda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/944,777

(22) Filed: Nov. 26, 2007

(65) Prior Publication Data

US 2008/0129975 A1    Jun. 5, 2008

(30) Foreign Application Priority Data

Nov. 30, 2006  (JP)  ............................. 2006-324693
Nov. 5, 2007   (JP)  ............................. 2007-287855

(51) Int. Cl.
  *G03B 27/72*  (2006.01)
  *G03B 27/42*  (2006.01)
  *G03B 27/54*  (2006.01)

(52) U.S. Cl. ............................. 355/71; 355/53; 355/67

(58) Field of Classification Search .................. 355/53, 355/67, 71

See application file for complete search history.

(56) References Cited

U.S. PATENT DOCUMENTS

| 7,345,741 B2 * | 3/2008 | Shiozawa et al. ............. 355/71 |
| 2003/0151730 A1 * | 8/2003 | Shinoda ........................ 355/69 |
| 2005/0024619 A1 * | 2/2005 | Shinoda et al. ............... 355/71 |
| 2005/0270608 A1 | 12/2005 | Shinozawa et al. |

FOREIGN PATENT DOCUMENTS

| JP | 07-201697 | 8/1995 |
| JP | 2006-019702 | 1/2006 |

* cited by examiner

*Primary Examiner*—Alan A Mathews
(74) *Attorney, Agent, or Firm*—Morgan & Finnegan LLP

(57) ABSTRACT

An exposure apparatus comprising an illumination optical system configured to illuminate a reticle with a light beam from a light source, and a projection optical system configured to project a pattern image of the reticle onto a substrate, the illumination optical system including a light-shielding member which is arranged near a plane conjugate to a pupil plane of the projection optical system and which can move along an optical axis of the illumination optical system, wherein the light-shielding member is moved such that a light intensity distribution on the pupil plane of the projection optical system becomes nonuniform.

9 Claims, 5 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus has conventionally been employed to fabricate very fine semiconductor devices such as a semiconductor memory and logic circuit using photolithography (exposure). The projection exposure apparatus projects and transfers the circuit pattern formed on a reticle (mask) onto, e.g., a wafer via a projection optical system. Along with the recent micropatterning of semiconductor devices, there are proposed various kinds of resolution enhanced technologies for resolving a pattern having a line width equal to or shorter than the wavelength of an exposure light source. One of these resolution enhanced technologies is a so-called modified illumination method (oblique illumination method). The modified illumination method does not illuminate a reticle with illumination light having a uniform angular distribution, but obliquely irradiates a reticle with illumination light. Examples of the modified illumination method are an annular illumination method, dipole illumination method, and quadrupole illumination method. In the modified illumination method, the angular distribution of a light beam which illuminates a reticle corresponds to the positional distribution of the pupil plane (Fourier transform plane) relative to a reticle (object plane).

The light intensity distribution of a light beam from a light source on the pupil plane is an axisymmetrical Gaussian distribution. To shape the light intensity distribution on the pupil plane into an annular shape, dipolar shape, or quadrupolar shape, an optical system for transforming the light intensity distribution is necessary. Examples of the simplest optical system which transforms the light intensity distribution are dipolar and quadrupolar aperture stops arranged on the exit surface of an optical integrator corresponding to the pupil plane. However, the use of an aperture stop extracts a component of the light beam from the light source. This makes it impossible to efficiently utilize the light beam from the light source, resulting in a decrease in illuminance on the reticle.

Japanese Patent Laid-Open No. 7-201697 proposes a technique of transforming the light intensity distribution on the incident surface of the optical integrator using a diffraction optical element. This technique can obtain a desired light intensity distribution without using any aperture stop.

To optimize modified illumination for the reticle, it is also proposed to change the intensity of an annular light beam (zone ratio) or the magnitude of the coherency σ (i.e., the numerical aperture of the illumination optical system on the exit side/the numerical aperture of the projection optical system on the incident side). For example, the zone ratio can be changed using an optical element having a conical concave incident surface and a flat exit surface, and an optical element having a flat incident surface and a conical convex exit surface. When these two optical elements are inserted in the optical axis, they can change the zone ratio or coherency a by forming an annular light beam and changing their interval. The coherency σ can be changed using a variable magnification zoom optical system.

Unfortunately, only changing the zone ratio or coherency σ is insufficient to optimize modified illumination (i.e., to optimize light which illuminates a circuit pattern to be transferred). For example, even when the zone ratio or coherency σ is changed, adjacent patterns may merge or an isolated pattern may become thin due to the influence of the proximity effect.

SUMMARY OF THE INVENTION

The present invention provides an exposure apparatus which achieves further optimization of light which illuminates a circuit pattern to be transferred.

According to one aspect of the present invention, there is provided an exposure apparatus comprising an illumination optical system configured to illuminate a reticle with a light beam from a light source, and a projection optical system configured to project a pattern image of the reticle onto a substrate, the illumination optical system including a light-shielding member which is arranged near a plane conjugate to a pupil plane of the projection optical system and which can move along an optical axis of the illumination optical system, wherein the light-shielding member is moved such that a light intensity distribution on the pupil plane of the projection optical system becomes nonuniform.

According to another aspect of the present invention, there is provided an exposure apparatus comprising an illumination optical system configured to illuminate a reticle with a light beam from a light source, and a projection optical system configured to project a pattern image of the reticle onto a substrate, the illumination optical system including a light-shielding member which is arranged near a plane conjugate to a pupil plane of the projection optical system and which can move along an optical axis of the illumination optical system, wherein the light-shielding member includes a transmission substrate configured to transmit the light beam, and a shielding unit which is formed on the transmission substrate and configured to shield the light beam, the shielding unit being on the optical axis of the illumination optical system.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENTS

The inventors of the present invention has found that in order to reduce the influence of the proximity effect and to further optimize light which illuminates a circuit pattern to be transferred, it is necessary to adjust the intensity in the light intensity distribution on the pupil plane of a projection optical system. For example, since the proximity effect is changed by adjusting the peak intensity position in the annular portion of an annular light intensity distribution to shift it to the inner or outer side, it is possible to further optimize light which illuminates a circuit pattern to be transferred. For this purpose, a diffraction optical element in which the peak intensity position is shifted from its center is available. In this case, however, one diffraction optical element is necessary for each light intensity distribution, so a large number of diffraction optical elements are necessary to achieve fine light intensity distribution adjustment. The present invention proposes an exposure apparatus capable of further optimizing light, which illuminates a circuit pattern to be transferred, in the following way. That is, the exposure apparatus adjusts the peak intensity distribution of the light intensity distribution on the pupil plane of a projection optical system without using a large number of diffraction optical elements.

Figure 1:
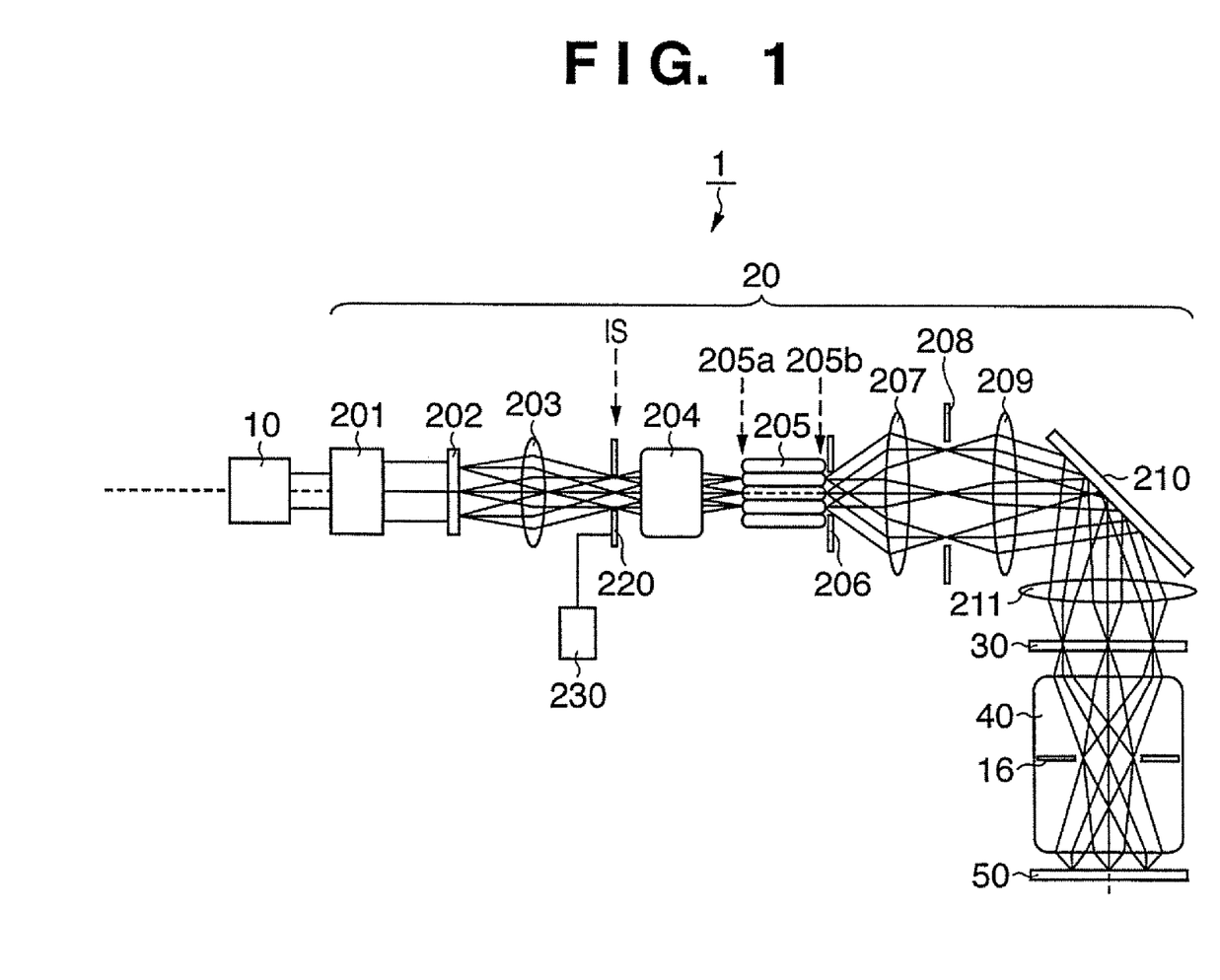
FIG. 1 is a schematic sectional view of an exposure apparatus according to the present invention.

With reference to the accompanying drawings, a description will now be given of an exposure apparatus of one embodiment according to the present invention. The same reference numeral in each figure denotes the same element, and a duplicate description thereof will be omitted. Here, FIG. 1 is a schematic sectional view of an exposure apparatus according to the present invention.

According to this embodiment, an exposure apparatus 1 is a projection exposure apparatus which transfers the pattern of a reticle 30 onto a wafer 50 by exposure in a step-and-scan manner. However, the exposure apparatus 1 can adopt a step-and-repeat manner or another exposure manner. The exposure apparatus 1 includes an illumination apparatus, a reticle stage which mounts the reticle 30, a projection optical system 40, and a wafer stage which mounts the wafer 50.

The illumination apparatus illuminates the reticle 30 on which a circuit pattern to be transferred is formed, and includes a light source unit 10 and illumination optical system 20.

The light source unit 10 uses, e.g., a KrF excimer laser having a wavelength of about 248 nm or an ArF excimer laser having a wavelength of about 193 nm as a light source. However, the light source of the light source unit 10 is not limited to an excimer laser and may use, e.g., an $F_2$ laser having a wavelength of about 157 nm.

The illumination optical system 20 illuminates the reticle 30 with the light beam from the light source unit 10. In this embodiment, the illumination optical system 20 includes a beam shaping optical system 201, diffraction optical element 202, condensing optical system 203, light-shielding member 220, driving unit 230, zoom optical system 204, plural-light forming unit 205, aperture 206, collimator lens 207, masking blade 208, imaging optical system 209, mirror 210, and imaging optical system 211.

The beam shaping optical system 201 shapes the light beam which is emitted by the light source unit 10 and enters it via a light-leading optical system including a mirror and relay lens into a desired shape.

The diffraction optical element 202 forms a desired light intensity distribution (having, e.g., an annular shape or quadrupolar shape) at the position of an illumination target surface IS via the condensing optical system 203. The diffraction optical element 202 uses, e.g., a computer generated hologram such as an amplitude distributed type hologram, a phase distributed type hologram, or kinoform. The diffraction optical element 202 can retreat from the optical path of the illumination optical system 20. The diffraction optical element 202 is arranged on, e.g., a turret which allows switching. By switching the currently used diffraction optical element 202 to another one, various kinds of light intensity distributions are formed on the illumination target surface IS.

The condensing optical system 203 serves to make the illumination target surface IS and the exit surface of the diffraction optical element 202 constitute a Fourier transform plane. With this arrangement, even when the light beam from the light source unit 10 slightly changes, the beam shaping optical system 201 controls the incident position and the angle of divergence of the light beam guided to the diffraction optical element 202 to always take predetermined values. This makes it possible to always maintain the light intensity distribution formed at the position of the illumination target surface IS constant.

The light-shielding member 220 is positioned near the pupil plane of the illumination optical system 20 to be movable in the optical axis direction of the illumination optical system. As the light-shielding member 220 moves in the optical axis direction of the illumination optical system, the light intensity distribution on the pupil plane of the projection optical system 40 becomes nonuniform. The movement of the light-shielding member especially changes a light intensity distribution in a direction perpendicular to the optical axis of the projection optical system. In other words, the light-shielding member 220 has a function of adjusting the light intensity distribution formed by the diffraction optical element 202. Although the light-shielding member 220 is inserted between the condensing optical system 203 and the zoom optical system 204 near the pupil plane in this embodiment, its position is not particularly limited as long as it is located near the pupil plane of the projection optical system. For example, the light-shielding member 220 may be located at the position of the aperture 206, i.e., near the exit surface 205b of the plural-light forming unit 205. The light-shielding member 220 is arranged on a turret which allows switching so that an optimal light-shielding member can be selected in accordance with the light intensity distribution formed by the diffraction optical element 202 (in accordance with the switching of the diffraction optical element 202).

The driving unit 230 drives the light-shielding member 220 in a direction parallel to the optical axis of the illumination optical system 20. The driving unit 230 uses, e.g., an actuator. The driving unit 230 can also drive the light-shielding member 220 outside the optical path of the illumination optical system 20 (i.e., retreat the light-shielding member 220 from the optical path of the illumination optical system 20).

Figure 2A:
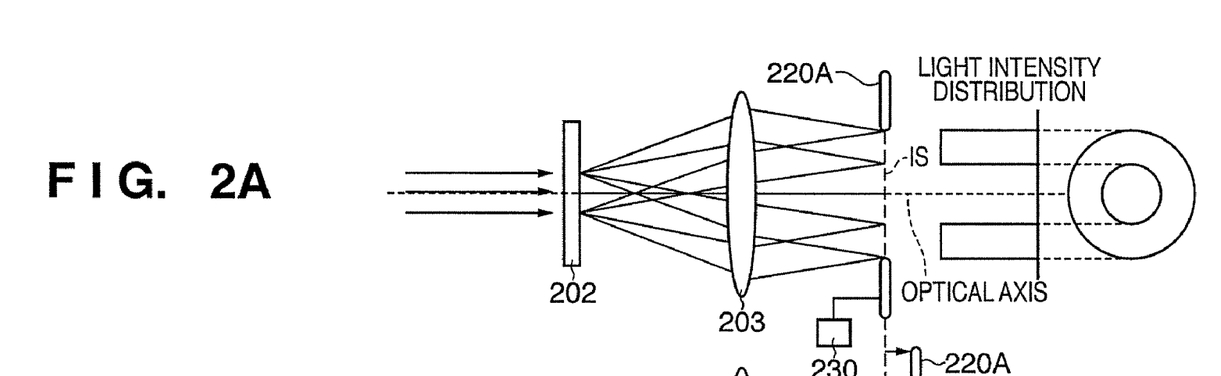
FIGS. 2A to 2C are views of the light intensity distributions formed on the pupil plane of a projection optical system by a light beam having passed through an aperture stop and its vicinity as an example of a light-shielding member of the exposure apparatus shown in FIG. 1.
Figures 2B, 2C:
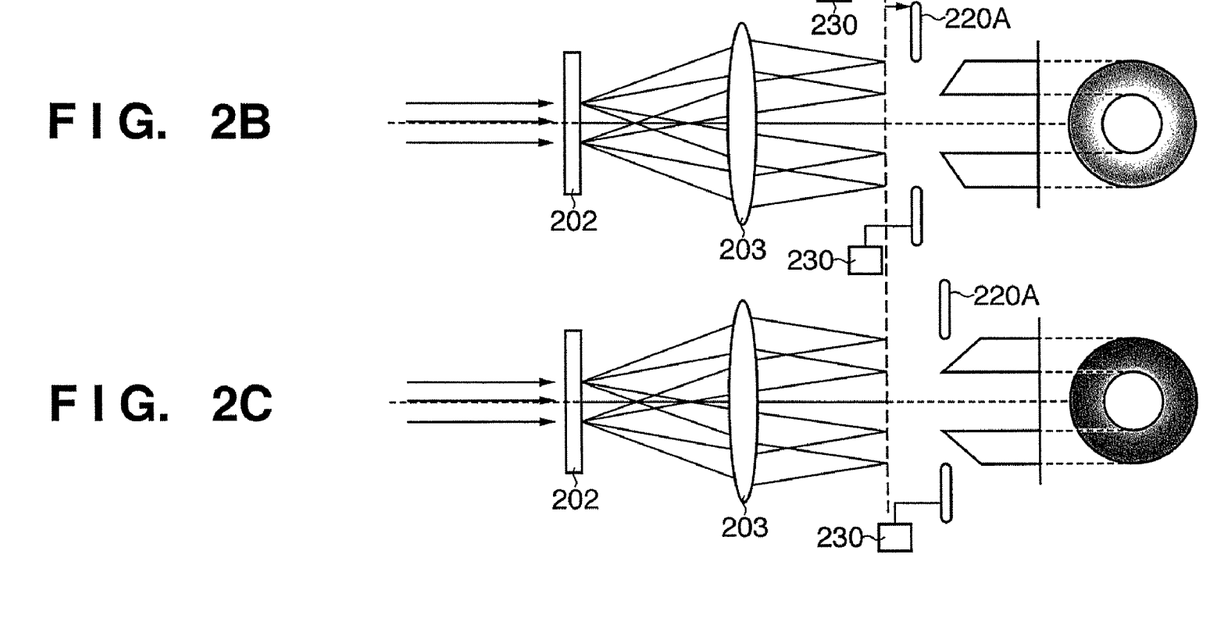

The light-shielding member 220 and driving unit 230 will be explained in detail here with reference to FIGS. 2A to 2C. FIGS. 2A to 2C are views of the light intensity distributions formed on the pupil plane of the projection optical system 40 by a light beam having passed through the light-shielding member 220 and its vicinity. FIGS. 2A to 2C exemplify a case wherein the light-shielding member 220 is an aperture stop 220A formed by one light-shielding plate having an aperture. The aperture has roughly the same outline of an annular light intensity distribution formed on the illumination target surface IS by the diffraction optical element 202. The optical axis of the illumination optical system passes through the center of the aperture. As shown in FIGS. 2A to 2C, the aperture stop 220A as the light-shielding member 220 limits the light beam (light quantity) guided to the vicinity of the outer periphery of the aperture of the aperture stop 220A to adjust the outer diameter of the light intensity distribution (annular distribution) formed by the diffraction optical element 202.

As shown in FIG. 2A, when the aperture stop 220A is positioned near the pupil plane of the illumination optical system 20, a light intensity distribution in which the light intensity in the annular portion is uniform is formed on the pupil plane of the projection optical system 40. In this state, the driving unit 230 drives the aperture stop 220A in a direction parallel to the optical axis of the illumination optical system 20. Then, as shown in FIG. 2B, a light beam guided to the vicinity of the outer periphery is shielded, which has passed through the aperture of the aperture stop 220A in the state shown in FIG. 2A. With this operation, the off-axis light intensity of the light beam having passed through the aperture stop 220A decreases. A nonuniform light intensity distribution in which the peak intensity position in the annular portion is shifted to the optical-axis side (inner side) is formed on the pupil plane of the projection optical system 40, as shown in FIG. 2B. Although the aperture stop 220A is driven in a direction in which it separates from the condensing optical system 203 as the direction parallel to the optical axis of the illumination optical system 20 in this embodiment, it may be driven in a direction in which it comes close to the condensing optical system 203. Also in the state shown in FIG. 2A, when the driving amount (i.e., the distance along which the aperture stop 220A is driven) of the aperture stop 220A is increased, it is possible to further decrease the off-axis light intensity, as shown in FIG. 2C. In this way, driving the aperture stop 220A in a direction parallel to the optical axis makes it possible to form a light intensity distribution in which the peak intensity position in the annular portion is shifted to the optical-axis side (inner side). In other words, driving the aperture stop 220A in a direction parallel to the optical axis forms a nonuniform light intensity distribution on the pupil plane of the projection optical system 40 and, especially, changes a light intensity distribution in a direction perpendicular to the optical axis of the projection optical system.

Figure 3A:
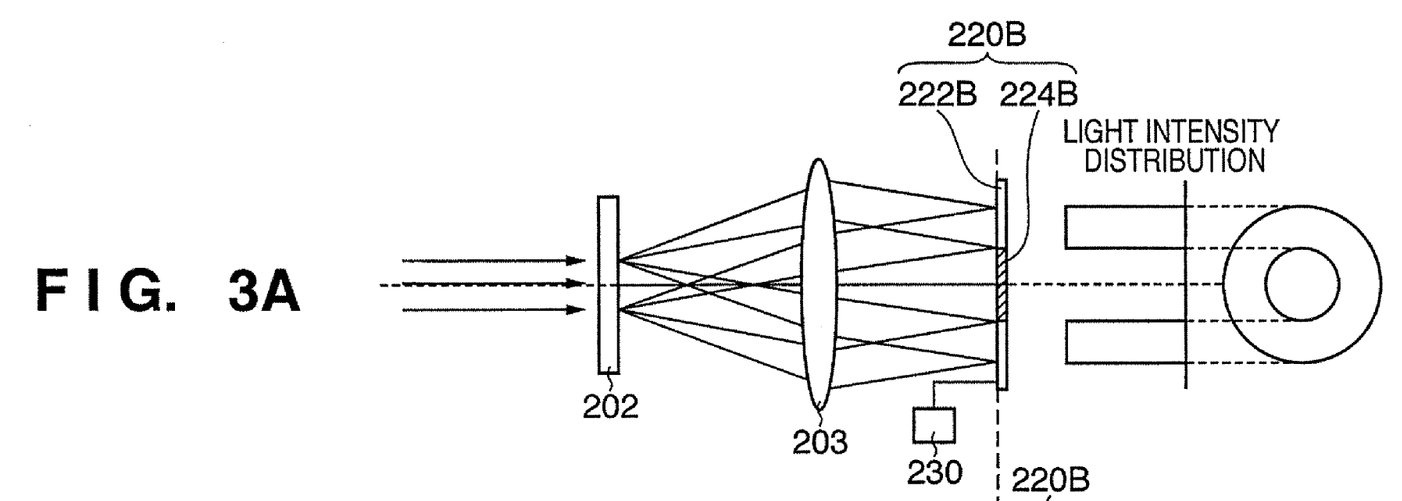
FIGS. 3A and 3B are views of the light intensity distributions formed on the pupil plane of the projection optical system by a light beam having passed through an optical member and its vicinity as an example of a light-shielding member of the exposure apparatus shown in FIG. 1.
Figure 3B:
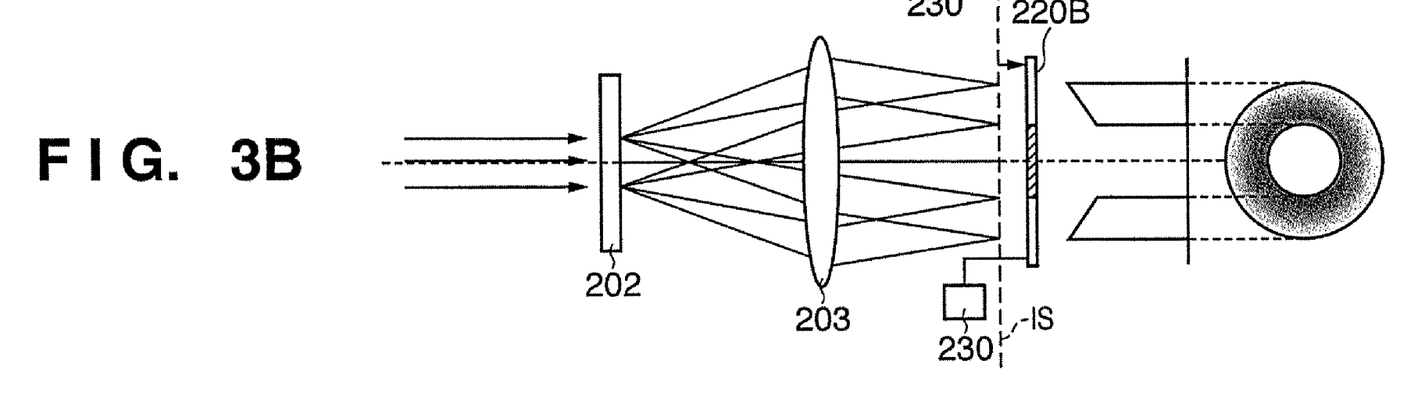

It is also possible to form a light intensity distribution in which the peak intensity position in the annular portion is shifted to the off-axis side (outer side), using an optical member 220B as shown in FIGS. 3A and 3B as the light-shielding member 220. FIGS. 3A and 3B are views of the light intensity distributions formed on the pupil plane of the projection optical system 40 by a light beam having passed through the optical member 220B and its vicinity as an example of the light-shielding member 220.

The optical member 220B includes a transmission substrate 222B and shielding unit 224B. The transmission substrate 222B transmits the light beam from the light source unit 10. The shielding unit 224B is formed on a part of the transmission substrate 222B and shields the light beam from the light source unit 10. The transmission substrate 222B is made of, e.g., quartz or fluorite. The shielding unit 224B is made of, e.g., chromium (Cr) and has a size almost equal to the inner diameter of an annular distribution formed by the diffraction optical element 202. The shielding unit 224B is formed such that when the optical member 220B is positioned near the pupil plane of the illumination optical system 20, the position of the shielding unit 224B coincides with that of the inner diameter of the annular distribution formed by the diffraction optical element 202. As shown in FIGS. 3A and 3B, the optical member 220B as the light-shielding member 220 limits the light beam (light quantity) guided to the vicinity of the outer periphery of the shielding unit 224B to adjust the inner diameter of the light intensity distribution (annular distribution) formed by the diffraction optical element 202.

As shown in FIG. 3A, when the optical member 220B is positioned near the pupil plane of the illumination optical system 20, a light intensity distribution in which the light intensity in the annular portion is uniform is formed on the pupil plane of the projection optical system 40. In this state, the driving unit 230 drives the optical member 220B in a direction parallel to the optical axis of the illumination optical system 20. Then, as shown in FIG. 3B, a light beam guided to the vicinity of the outer periphery is shielded, which has passed through the optical member 220B in the state shown in FIG. 3A. With this operation, the intensity of the light beam having passed through the optical member 220B decreases on the optical-axis side (a portion close to the optical axis). A nonuniform light intensity distribution in which the peak intensity position in the annular portion is shifted to the off-axis side (outer side) is formed on the pupil plane of the projection optical system 40, as shown in FIG. 3B. Although the optical member 220B is driven in a direction in which it separates from the condensing optical system 203 as the direction parallel to the optical axis of the illumination optical system 20 in this embodiment, it may be driven in a direction in which it comes close to the condensing optical system 203. Also in the state shown in FIG. 3A, when the driving amount (i.e., the distance along which the optical member 220B is driven) of the optical member 220B is increased, it is possible to further decrease the light intensity on the optical-axis side. In this way, driving the optical member 220B in a direction parallel to the optical axis makes it possible to form a light intensity distribution in which the peak intensity position in the annular portion is shifted to the off-axis side (outer side). In other words, driving the optical member 220B in a direction parallel to the optical axis forms a nonuniform light intensity distribution on the pupil plane of the projection optical system 40 and, especially, changes a light intensity distribution in a direction perpendicular to the optical axis of the projection optical system.

The light-shielding member 220 in the exposure apparatus 1 can also change the peak intensity position of the light intensity distribution on the pupil plane of the projection optical system 40 in cooperation with the driving unit 230. The exposure apparatus 1 can optimize light, which illuminates the pattern of the reticle 30, by driving the light-shielding member 220 in accordance with the pattern of the reticle 30 and forming a nonuniform light intensity distribution. Since the exposure apparatus 1 can adjust the peak intensity position of the light intensity distribution on the pupil plane of the projection optical system 40 by simply using the light-shielding member 220 and driving unit 230, the size and cost of the apparatus never increase. As a matter of course, when the aperture stop 220A and the optical member 220B can be selectively switched, it is possible to shift the peak intensity position of the light intensity distribution on the pupil plane of the projection optical system 40 to either the optical-axis side or the off-axis side.

The driving unit 230 preferably drives the light-shielding member 220 to continuously change a light intensity distribution on the pupil plane of the projection optical system 40 in a direction perpendicular to the optical axis of the projection optical system 40. This makes it possible to finely adjust the peak intensity position of the light intensity distribution on the pupil plane of the projection optical system 40. In addition, the driving unit 230 preferably drives the light-shielding member 220 to maintain the coherency constant, as shown in FIGS. 2A to 2C, 3A and 3B. This is because the coherency and the peak intensity position of the light intensity distribution are adjusted independently. That is, the zoom optical system 204 can adjust a change in coherency upon driving the light-shielding member 220.

Referring back to FIG. 1, the zoom optical system 204 projects (images) the light pattern on the illumination target surface IS onto an incident surface 205a of the plural-light forming unit 205 at various magnifications.

The plural-light forming unit 205 forms a light source image having a shape corresponding to the light pattern image on the illumination target surface IS on an exit surface 205b. The plural-light forming unit 205 is formed by, e.g., a fly-eye lens including a plurality of microlenses or a fiber bundle, and forms a surface light source including a plurality of point light sources on the exit surface 205b. The microlenses of the fly-eye lens may be diffraction optical elements or may be arranged in an array.

The aperture 206 is located near the exit surface 205b of the plural-light forming unit 205 and shields a light beam to obtain a desired light source image.

The collimator lens 207 illuminates the reticle 30 via the masking blade 208, imaging optical system 209, mirror 210, and imaging optical system 211 with light beams from a large number of converging points which are formed by the plural-light forming unit 205 and serve as secondary sources.

The masking blade 208 includes, e.g., four independently driven light-shielding plates and limits an illumination region on the reticle 30. The masking blade 208 is optically conjugate to the reticle 30.

The imaging optical systems 209 and 211 each have an object plane corresponding to the position of the masking blade 208 and an imaging plane corresponding to the position of the reticle 30. The imaging optical systems 209 and 211 project an illuminance distribution obtained at the position of the masking blade 208 onto the reticle 30.

The reticle 30 has a circuit pattern and is supported and driven by the reticle stage (not shown). Light diffracted by the reticle 30 is projected onto the wafer 50 via the projection optical system 40. Since the exposure apparatus 1 adopts a step-and-scan manner, it transfers the pattern of the reticle 30 onto the wafer 50 by scanning them.

The projection optical system 40 projects the pattern of the reticle 30 onto the wafer 50. The projection optical system 40 can use a dioptric system, catadioptric system, or catoptric system. The projection optical system 40 includes, at its pupil plane, a stop 45 for controlling the numerical aperture of the projection optical system 40.

The wafer 50 is supported and driven by the wafer stage (not shown). Although the wafer 50 is used as the exposure target substrate in this embodiment, it is also possible to use another substrate such as a glass plate. The wafer 50 is coated with a photoresist.

In exposure, the illumination optical system 20 illuminates the reticle 30 with a light beam emitted by the light source unit 10. The projection optical system 40 images the light beam with a pattern, which has passed through the reticle 30, on the wafer 50. As described above, the illumination optical system 20 used in the exposure apparatus 1 can adjust the light intensity distribution on the pupil plane of the projection optical system 40 to become nonuniform by the light-shielding member 220 and driving unit 230 and, especially, a light intensity distribution in a direction perpendicular to the optical axis of the projection optical system 40. Hence, the exposure apparatus 1 can optimize light which illuminates the pattern of the reticle 30, thus providing devices with high throughput and high quality (e.g., a semiconductor device, an LCD device, an image sensing device (e.g., a CCD), and a thin-film magnetic head).

Figure 4:
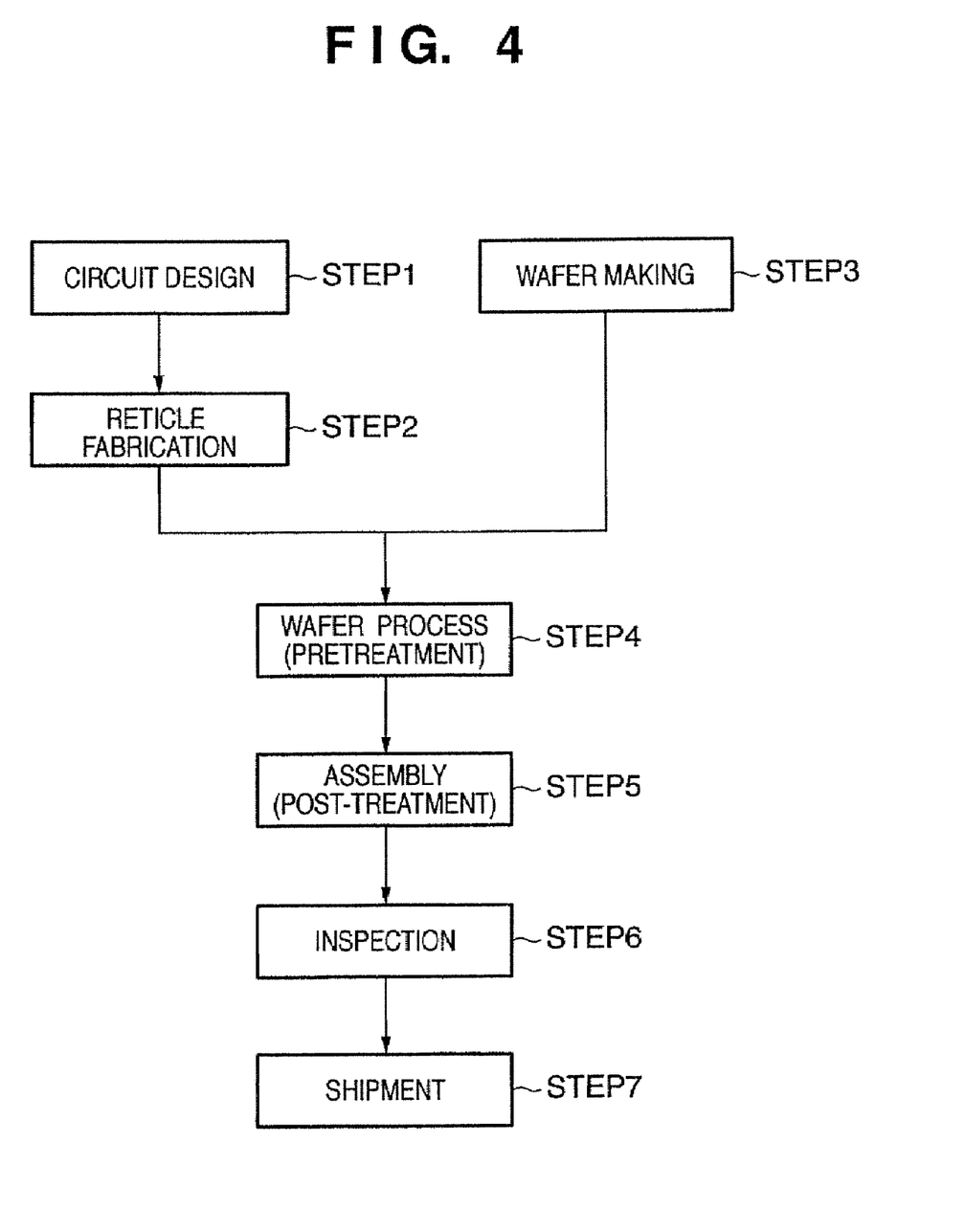
FIG. 4 is a flowchart for explaining a method for fabricating devices.
Figure 5:
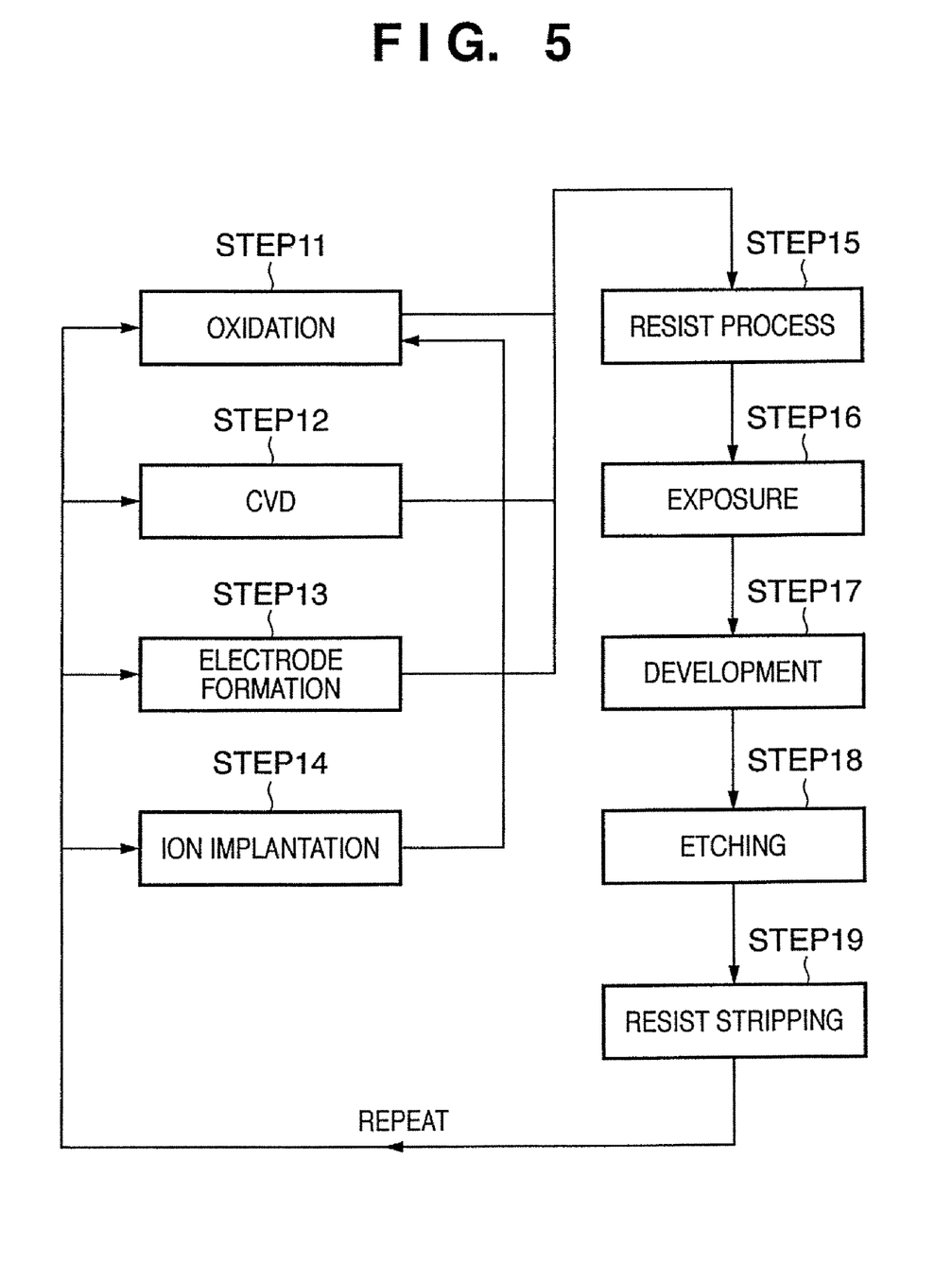
FIG. 5 is a detail flowchart of a wafer process in Step 4 of FIG. 4.

Referring now to FIGS. 4 and 5, a description will be given of an embodiment of a device fabrication method using the above mentioned exposure apparatus 1. FIG. 4 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-324693 filed Nov. 30, 2006, and Japanese Patent Application No. 2007-287855 filed Nov. 5, 2007, which are hereby incorporated by reference herein in their entirety.

What is claimed is:

1. An exposure apparatus comprising:
   an illumination optical system configured to illuminate a reticle with a light beam from a light source; and
   a projection optical system configured to project a pattern image of the reticle onto a substrate;
   said illumination optical system including a light-shielding member which is arranged near a plane conjugate to a pupil plane of said projection optical system and which can move along an optical axis of said illumination optical system,
   wherein said light-shielding member is moved such that a light intensity distribution on the pupil plane of said projection optical system becomes nonuniform.

2. The apparatus according to claim 1, wherein the movement of said light-shielding member changes a light intensity in a radius direction from a position of an optical axis of said projection optical system among the light intensity distribution.

3. The apparatus according to claim 1, wherein said light-shielding member is one light-shielding plate.

4. The apparatus according to claim 1, wherein said light-shielding member is moved to maintain a coherency constant.

5. An exposure apparatus comprising:

an illumination optical system configured to illuminate a reticle with a light beam from a light source; and a projection optical system configured to project a pattern image of the reticle onto a substrate;

said illumination optical system including a light-shielding member which is arranged near a plane conjugate to a pupil plane of said projection optical system and which can move along an optical axis of said illumination optical system, wherein said light-shielding member includes a transmission substrate configured to transmit the light beam, and a shielding unit which is formed on said transmission substrate and configured to shield the light beam, said shielding unit being on the optical axis of said illumination optical system.

6. The apparatus according to claim 5, wherein the movement of said light-shielding member changes a light intensity in a radius direction from a position of an optical axis of said projection optical system among the light intensity distribution.

7. The apparatus according to claim 5, wherein said light-shielding member is moved to maintain a coherency constant.

8. A device fabrication method comprising steps of:

exposing a substrate using an exposure apparatus according to claim 1; and performing a development process for the substrate exposed.

9. A device fabrication method comprising steps of:

exposing a substrate using an exposure apparatus according to claim 5; and performing a development process for the substrate exposed.

* * * * *